(12) United States Patent
Lim

(10) Patent No.: US 6,850,174 B2
(45) Date of Patent: Feb. 1, 2005

(54) METHOD AND APPARATUS FOR RECOGNIZING KEY

(75) Inventor: Heui-Do Lim, Suwon-shi (KR)

(73) Assignee: Samsung Electronics Co., Ltd. (KR)

( * ) Notice: Subject to any disclaimer, the term of this patent is extended or adjusted under 35 U.S.C. 154(b) by 577 days.

(21) Appl. No.: 10/038,042

(22) Filed: Jan. 3, 2002

(65) Prior Publication Data

US 2002/0130842 A1 Sep. 19, 2002

(30) Foreign Application Priority Data

Jan. 10, 2001 (KR) .......................................... 2001-1263

(51) Int. Cl.[7] .............................................. H03M 11/00
(52) U.S. Cl. ......................... 341/26; 710/67; 340/14.1
(58) Field of Search .................... 341/26, 22; 340/14.1; 710/67

(56) References Cited

U.S. PATENT DOCUMENTS 5,386,584 A    1/1995   Verstegen et al.
6,426,710 B1 * 7/2002  Chang et al. .................. 341/26
6,727,829 B2 * 4/2004  Jam ............................. 341/20

FOREIGN PATENT DOCUMENTS

EP    0 188 151    12/1985
EP    0 635 947    5/1994

OTHER PUBLICATIONS

European Search Report dated Oct. 2, 2003 issued in a counterpart application, namely, Appln. No. 02000610.2.

* cited by examiner

*Primary Examiner*—Albert K Wong
(74) *Attorney, Agent, or Firm*—Dilworth & Barrese, LLP

(57) ABSTRACT

A method is provided for recognizing a key in a terminal apparatus having a key matrix structure. The method according to the invention includes the steps of recognizing pushing of and detaching from a key by using a difference between a previous key status value on the key matrix and a current key status value according to a change of the key status, and obtaining a positional value of an inputted key on the key matrix by using a relational expression considering difference values between adjacent rows in each line and between adjacent lines in each row and a difference between the previous key value and the current key value.

9 Claims, 4 Drawing Sheets

FIG. 2

|  | b5 | b6 | b7 | b8 | b9 |
|---|---|---|---|---|---|
| b0 | key[0][0] | key[0][1] | key[0][2] | key[0][3] | key[0][4] |
| b1 | key[1][0] | key[1][1] | key[1][2] | key[1][3] | key[1][4] |
| b2 | key[2][0] | key[2][1] | key[2][2] | key[2][3] | key[2][4] |
| b3 | key[3][0] | key[3][1] | key[3][2] | key[3][3] | key[3][4] |
| b4 | key[4][0] | key[4][1] | key[4][2] | key[4][3] | key[4][4] |

METHOD AND APPARATUS FOR RECOGNIZING KEY

PRIORITY

This application claims priority to an application entitled "Method and Apparatus for Recognizing Key" filed with the Korean Industrial Property Office on Jan. 10, 2001 and assigned Serial No. 2001-1263, the contents of which are hereby incorporated by reference.

BACKGROUND OF THE INVENTION

1. Field of the Invention

The present invention relates to an input apparatus, and in particular, to a method for recognizing keys in a keypad or a keyboard of a key matrix structure.

2. Description of the Related Art

Most of the electronic products widely used these days such as computers, portable mobile terminals, etc. employ a keypad or a keyboard having a key matrix structure as a key input apparatus. A terminal control unit comprising a key input apparatus having a key matrix structure recognizes an input of a key by a user with a key interrupt technique or a polling technique. According to the polling technique, the terminal control unit checks if any change occurs in the key status in a predetermined cycle. According to the key interrupt technique, any change of a key status in a keypad or a keyboard is generated to a terminal control unit as a key interrupt, and the terminal control unit recognizes the key. When a key interrupt occurs, the control unit confirms the current key status by checking each bit of an inner register to learn a change in which key has generated the key interrupt. The control unit also confirms which key has been changed through comparison with the previous key status.

The following is a detailed description of a structure of a key matrix according to each bit, as shown in FIG. 2, as well as a construction of an inner register indicating a result of a key interrupt of a key matrix, as shown in FIG. 3. The examples of key matrix structures in FIGS. 2 and 3 have a key matrix structure of 5×5. Under the status of not pushing any keys on the key matrix (initial status), all the bits from b0 to b9 of the 10-bit inner register are "0". This means that an output value of the key matrix is "00000 00000". If the key in 0 line at 0 row on the key matrix, i.e., the key [0][0], is pushed by the user, a key interrupt occurs. The resultant output of the interrupt displayed on the 10-bit register is "00001 00001", i.e., 0x21 (H) (H signifies hexa-decimal). To confirm pushing of the key [0][0] in 0 line at 0 row, the control unit checks which bit is "1" in each of the upper 5 bits and the lower 5 bits of the 10-bit inner register to confirm if the currently pushed key is key [0][0]. If the user pushes a key [1][1] under this status, the key interrupt value displayed in the 10-bit register by the key interrupt from the key matrix is 0x63 (H). The predictable keys having one bit when dividing the 10-bit register into the upper 5 bits and the lower 5 bits are key [0][0], key [0][1], key [1][0] and key [1][1]. If the user had previously pushed the key [0][0] and currently pushed the key [1][1], the control unit should logically compare the previous key status with the current key status to determine that the currently pushed key is key [1][1] among key [0][0], key [0][1], key [1][0] and key [1][1].

SUMMARY OF THE INVENTION

The conventional art described above has the following problems.

First, whenever a key interrupt occurs from the key matrix, the control unit needs to confirm the status of each bit. The second problem is that the control unit needs to confirm the status of each bit to set the number of possible cases. The third problem is that all the previous status of the key needs to be stored. The fourth problem is that it is required to find what kind of change in the key has generated the key interrupt by logically comparing the previous key status with all of the currently possible key status.

It is, therefore, an object of the present invention to provide a method for easily recognizing a positional value of a key in accordance with an input of the key.

It is another object of the present invention to provide a method for finding in which key a change has generated a key interrupt, if occurred from a key matrix, with the value of the key interrupt per se through arithmetic calculation.

To achieve the above objects, there is provided a method for recognizing a key in a terminal apparatus having a key matrix structure, the method comprising the steps of: recognizing pushing a key and detaching from the key by using a difference in status values between a previous key and a current key on a key matrix; and obtaining a positional value of an inputted key by using a relational expression that considers difference values between the adjacent rows in each line as well as between the adjacent lines in each row and a difference in status values between the previous key and the current key.

The method according to another aspect of the present invention comprises the steps of: calculating variants i and j by using the relation that the status value of the previous key on a key matrix and the status value of the current key in accordance with change of the key status becomes the status value of the current key−status value of the previous key=$2^{j+5}+2^{j'}$, obtaining a positional value of key [i][j] of an input key on the key matrix (here, "i" represents a position of the line of the key matrix, while "j" represents a position of the row of the key matrix).

BRIEF DESCRIPTION OF THE DRAWINGS

The above and other objects, features and advantages of the present invention will become more apparent from the following detailed description when taken in conjunction with the accompanying drawings, in which:

FIG. 2 is a table illustrating a key matrix according to each bit;

DETAILED DESCRIPTION OF A PREFERRED EMBODIMENT

A preferred embodiment of the present invention will be described herein below with reference to the accompanying drawings. In the following description, well-known functions or constructions are not described in detail since they would obscure the invention in unnecessary detail.

Figure 1:
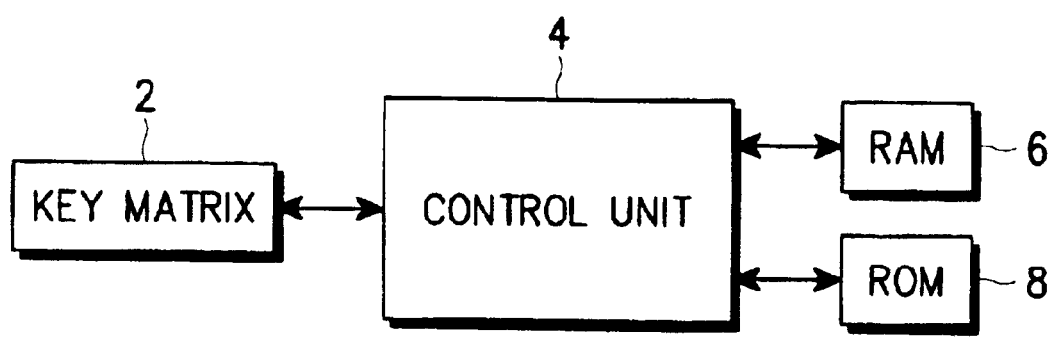
FIG. 1 is a block diagram illustrating a construction applicable to an embodiment of the present invention.

FIG. 1 is a block diagram illustrating a construction applicable to an embodiment of the present invention, which comprises a key matrix 2, a control unit 4, a RAM 6 and a ROM 8. FIG. 2 is a table illustrating a key matrix according to each bit by exemplifying a key matrix structure of 5×5.

Figure 3:
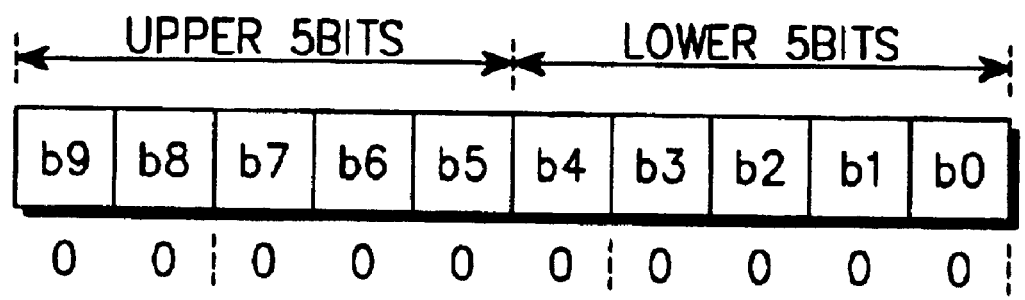
FIG. 3 is a diagram illustrating a construction of an inner register displaying a result of a key interrupt of a key matrix.

FIG. 3 is a diagram illustrating a construction of an inner register displaying a result of a key interrupt of a key matrix. The inner register in FIG. 3 is a 10-bit register composed of an upper 5 bits and a lower 5 bits to represent the rows and lines of the 5×5 key matrix shown in FIG. 2.

If the user inputs a key, the change in key status of the key matrix 2 is provided for the control unit 4 as a generation of a key interrupt. The interrupt resultant value is displayed on the inner register of the control unit 4 as shown in FIG. 3. The control unit 4 performs an operation of recognizing a position of the inputted key on the key matrix 2 as well as a change of the key status based on the key interrupt resultant value displayed in the inner register. The RAM 6 comprises a previous register (hereinafter, referred to as a "P register") for temporarily storing the status value of the previous key according to an embodiment of the present invention, and a current register (hereinafter, referred to as a "C register") for temporarily storing a status value of the current key.

Figure 4:
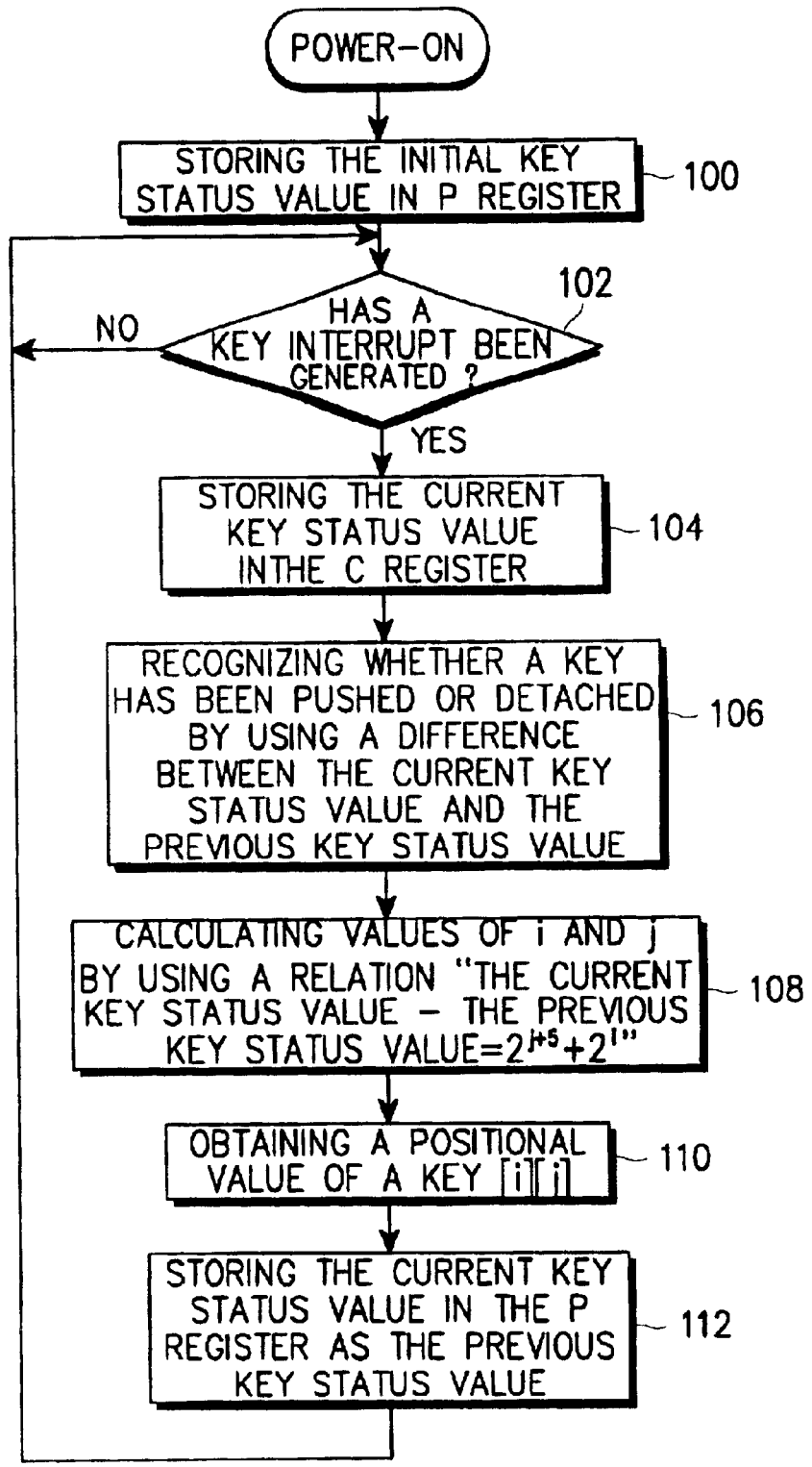
FIG. 4 is a flow chart illustrating a control of recognizing a key according to an embodiment of the present invention.

FIG. 4 is a flow chart illustrating a control of recognizing a key according to an embodiment of the present invention. According to an embodiment of the present invention, when a key interrupt occurs due to change of the key status on the key matrix 2, it is possible to confirm in which key a change has occurred based on the interrupt resultant value per se displayed in the inner register as shown in FIG. 3.

For that purpose, an embodiment of the present invention defines a relational expression to understand the regularity of a matrix in the key matrix as shown in FIG. 2 and to obtain a positional value of the currently inputted key based on the arithmetic calculation only by reference to Table 1 below.

TABLE 1

| SUM = 3E0 | | | | | |
|---|---|---|---|---|---|
| SUM = 1F | b5(0 × 20) | b6(0 × 40) | b7(0 × 80) | b8(0 × 100) | b9(0 × 200) |
| b0(0 × 01) | 0 × 21(33) | 0 × 41(65) | 0 × 81(129) | 0 × 101(257) | 0 × 201(513) |
| b1(0 × 02) | 0 × 22(34) | 0 × 42(66) | 0 × 82(130) | 0 × 102(258) | 0 × 202(514) |
| b2(0 × 04) | 0 × 24(36) | 0 × 44(68) | 0 × 84(132) | 0 × 104(260) | 0 × 204(516) |
| b3(0 × 08) | 0 × 28(40) | 0 × 48(72) | 0 × 88(136) | 0 × 108(264) | 0 × 208(520) |
| b4(0 × 10) | 0 × 30(48) | 0 × 50(80) | 0 × 90(144) | 0 × 110(272) | 0 × 210(528) |

In the example of "0x21(33)" in Table 1 above, the value "0x21" is an expression of hexa-decimal, while the value "33" is an expression of decimal.

In the above Table 1, the regularities of lines and rows in the key matrix 2 can be obtained as follows.
(a) Regularity of Lines The difference values (bit weight values) between adjacent lines in the same row are 1, 2, 4, 8 and 16, respectively, and can be expressed such as $2^0$, $2^1$, $2^2$, $2^3$, $2^4$, respectively.
(a) Regularity of Rows The difference values (bit weight values) between adjacent rows in the same line are 32, 64, 128, 256 and 512, respectively, and can be expressed such as $2^{5+0}$, $2^{5+1}$, $2^{5+2}$, $2^{5+3}$ and $2^{5+4}$, respectively.

The positional value key [i][j] where the corresponding line and row cross can be defined by the following relational expression based on the above regularities of lines and rows.

$$key[i][j]=2^{5+j}+2^i$$

Here, i and j are variants representing a line and a row on the key matrix to inform the positional value of the key, the status of which has been changed. An example of the positional value of the key using the above relational expression is as follows.

$$key[0][0]=2^{5+0}+2^0=0\times21(33).$$

The current status key value is a sum of values in lines at the same rows and values in rows at the same lines. These values are the lower bit values from pushed key matrix.

The following is a detailed description of an operation according to an embodiment of the present invention made with reference to FIGS. 1 to 4.

When a power is supplied to a terminal, the control unit 4 proceeds with step 100 in FIG. 4 to confirm the key status of the key matrix 2 and stores the initial key status value of "00 00000 00000", i.e., 0x00(H) (this value represents the initial stage when no key is pushed), in a P register of the RAM 6. Thereafter, the control unit 4 proceeds with step 102 to determine whether or not any key interrupt is generated. For instance, if key [0][0] is pushed by the user, a key interrupt is generated from the key matrix 2. The control unit 4 proceeds with step 104 to store the current key status value of "00 00001 00001", i.e., 0x21(H) according to the key interrupt in a C register of the RAM 6. The control unit 4 then subtracts a previous key status value stored in the P register from the current key status value stored in the C register to determine whether the subtracted value is a positive number or a negative number. Based on this determination, the control unit 4 can learn whether the key interrupt has been generated by pushing of the key or by detaching from the key. If the resultant value of "the current key status value−previous key status value" is a positive number, the key interrupt is attributable to pushing of the key. Otherwise, the key interrupt is attributable to detaching of the key. The control unit 4 can perform relevant operations by using the information on pushing or detaching of the key. For instance, if the number "2" key has been pushed and detached immediately while the number "1" key is being pushed, such a pushing and detaching of the keys can be recognized according to an embodiment of the present invention, and an operation relevant to the recognition can be performed. In the above embodiment, "current key status value−previous key status value"=0x21(H)−0x00(H)=0x21 (H). The resultant value is a positive number, which means that the interrupt has been generated by pushing the key.

Thereafter, the control unit 4 proceeds with step 108. The variants i and j are calculated by using a relation "current key status value−previous key status value"=0x21(H)−0x00 (H)=$2^5+2^0=2^{j+5}+2^j$. The calculated variants i and j refer to the line and row of the key matrix indicating the positional value of the changed key status. In short, it is apparent from the above embodiment that the key interrupt has been generated by pushing the key [0][0].

Thereafter, the control unit 4 stores the current key status value stored in the C register, to detect the change in the next key status, in the P register as a previous key status value. The control unit 4 then returns to step 102 to repeat the same procedure thereafter.

For instance, if the key pushed next is key [1][1], the current key status value is 0x63(H), while the previous key status value is 0x21(H). "Current key status value−previous key status value"=0x63(H)−0x21(H)=0x42(H)=$2^6+2^1$=$2^{j+5}+2^i$. Therefore, both of the weight values i and j are 1. Accordingly, it is apparent that the key [1][1] has been pushed on the key matrix. Meanwhile, assuming that the key [0][1] has been pushed after key [0][0], the current key status value=0x61(H), while the previous key status value is 0x21(H). The "current key status value−the previous key status value"=0x631(H)−0x21(H)=0x40(H)=$2^6=2^{j+5}+2^i$. Here, the j value is 1, but the i value cannot be obtained. This is the case when a key has been pushed in the same line. The previous key status value stored in the P register is 0x21=$2^5+2^0$. Since the position of the line is 0, it is evident that key [0][1] has been pushed.

As described above, the present invention enables the user to learn through calculation that a change in which key has generated a key interrupt, if occurred due to a change of the key status on a key matrix, based on a resultant value of the key interrupt. Therefore, the positional value of a key according to an input of the key can be easily recognized.

While the invention has been shown and described with reference to an embodiment of a key interrupt technique and a "5×5" key matrix structure, it will be understood by those skilled in the art that a polling technique and variation into a "k×m" (k and m are natural numbers) key matrix structure may also be made without departing from the spirit and scope of the invention as defined by the appended claims.

What is claimed is:

1. A method for recognizing a key in a terminal apparatus having a key matrix structure consisting of a plurality of lines and rows, in which corresponding bits are respectively assigned, the method comprising the steps of:

recognizing pushing of and detaching from a key by using a difference between a current key status value on the key matrix and a previous key status value according to a change of the key status, and obtaining a positional value of an inputted key on the key matrix by using a relational expression considering difference values between adjacent rows in each line and between adjacent lines in each row and a difference between the previous key value and the current key value.

2. The method of claim 1, wherein the relational expression is $2^{j+5}+2^i$ whereby i and j are variants representing the lines and rows of the key matrix.

3. The method of claim 1, wherein the pushing of the key is recognized when a value subtracting the previous key status value from the current key status value is a positive number, and the detaching from the key is recognized when a value subtracting the previous key status value from the current key status value is a negative number.

4. A method for recognizing a key in a terminal apparatus having a matrix structure, the method comprising the steps of:

recognizing pushing of and detaching from a key by using a difference between a previous key status value on the key matrix and a current key status value according to a change of the key status;

calculating variants i and j by using a relation "the current key status value−the previous key status value=$2^{j+5}+2^i$"; and obtaining a positional value of an inputted key on the key matrix by means of i and j.

5. The method of claim 4, wherein the positional value of the inputted key is key [i][j] whereby "i" represents a position of a line in the key matrix, and "j" represents a position of a row in the key matrix.

6. A method for recognizing a key in a terminal apparatus having a key matrix structure, comprising the steps of:

calculating variants i and j by using a relation "a current key status value−a previous key status value=$2^{j+5}+2^i$" between the previous key status value on the key matrix and the current key status value according to a change of the key status; and obtaining a positional value of an inputted key that is key [i][j] on the key matrix by means of the variants i and j whereby "i" represents a position of a line in the key matrix, and "j" represents a position of a row in the key matrix.

7. A method for recognizing a key in a terminal apparatus having a key matrix structure, comprising the steps of:

storing a first key status value according to a change of a key status on the key matrix in a first temporary storing unit;

storing a second key status value according to a change of a key status after storing the first key status value in a second temporary storing unit;

recognizing pushing of and detaching from a key on the key matrix by using a difference between the stored first key status value and the second key status value;

calculating variants i and j by using a relation "the second key status value−the first key status value=$2^{j+5}+2^i$"; and obtaining a positional value of an inputted key on the key matrix by using the variants i and j.

8. The method of claim 7, wherein a positional value of an inputted key is [i][j] whereby "i" represents a position of a line in the key matrix, and "j" represents a position of a row in the key matrix.

9. The method of claim 7, further comprising the step of obtaining a positional value of the inputted key, and storing the second key status value in the first temporary storing unit.

* * * * *